United States Patent [19]

Bonniau et al.

[11] Patent Number: 5,487,484
[45] Date of Patent: Jan. 30, 1996

[54] DEVICE FOR THE AIRTIGHT CLOSING OF A PACKAGE WITH FAST OPEN-AND-SHUT SYSTEM

[75] Inventors: Philippe Bonniau, Houilles; Jean Chazelas, Paris, both of France

[73] Assignee: Thomson - CSF, Paris, France

[21] Appl. No.: 258,204

[22] Filed: Jun. 10, 1994

[30] Foreign Application Priority Data

Jun. 11, 1993 [FR] France ................... 93 07051

[51] Int. Cl.⁶ ............. B65D 55/00; B65D 45/32
[52] U.S. Cl. ............. 220/201; 220/256; 220/319; 220/320
[58] Field of Search .................. 220/201, 203, 220/319, 320, 240, 256

[56] References Cited

U.S. PATENT DOCUMENTS

| | | | |
|---|---|---|---|
| 2,575,446 | 11/1951 | Gollong | 220/319 |
| 2,642,911 | 6/1953 | Shazor, Jr. | 220/319 X |
| 4,331,258 | 5/1982 | Geschwind | 220/200 X |
| 4,778,074 | 10/1988 | Kelly | 220/320 X |
| 5,176,884 | 1/1993 | Taschner et al. | 220/201 X |

FOREIGN PATENT DOCUMENTS

| | | |
|---|---|---|
| 2115614A | 9/1983 | United Kingdom . |
| 2256321A | 12/1992 | United Kingdom . |

OTHER PUBLICATIONS

Patent Abstracts Of Japan, vol. 009, No. 061, Mar. 19, 1985 & JP-A-59 200 600 Nov. 13, 1984.

*Primary Examiner*—Gary E. Elkins
*Assistant Examiner*—Nathan Newhouse
*Attorney, Agent, or Firm*—Oblon, Spivak, McClelland, Maier & Neustadt

[57] ABSTRACT

A closing device, for airtight closing of a package by use of a removable lid, has a facing lid fixedly joined to the package and springs made of shape memory alloy resting on the lid and the facing lid. The facing lid may be fixedly joined to the package by brackets or by other fixing mechanisms. These fixing mechanisms may include screws or may include a groove and tongue arrangement. The fixing mechanism may also include a ring made of a shape memory alloy forcing a flexible part of the facing plate against the package.

8 Claims, 3 Drawing Sheets

DEVICE FOR THE AIRTIGHT CLOSING OF A PACKAGE WITH FAST OPEN-AND-SHUT SYSTEM

BACKGROUND OF THE INVENTION

1. Field of the Invention

The invention relates to a device for the airtight closing of a package with a fast open-and-shut system.

2. Description of the Prior Art

One of the main problems that arise with metal packages comprising electronic circuits, especially microwave circuits, is that of sealing these circuits hermetically against the ambient air. These packages are generally manufactured by machining a metal block to form a packaged body comprising a bottom wall and side walls. The components and circuits that this packaged body must contain are placed within it, and a metal lid is soldered to this body, for example by laser soldering. Now, it often happens that the components and circuits of this package need to be adjusted after the performance of measurements which are valid only if there is very good electrical contact between the lid and the body of the package. This hitherto could be obtained only with said soldering of the lid. The reopening of these packages to carry out these adjustments or -to carry out maintenance operations or operations for the exchange of defective components makes it necessary to unsolder the lid. This is difficult to carry out without damaging the package.

Summary of the Invention

An object of the present invention is a device for the airtight closing of packages that enables these packages to be easily opened and shut several times without being damaged.

The closing device of the invention, which is of the type with a lid fixed to an open face of a package, comprises at least one shape memory alloy applying the lid to the open face of the package.

According to a first embodiment, springs made of shape memory alloys are positioned between the lid and a facing plate fixedly joined to the package.

According to another embodiment, the lid is made of a shape memory alloy, the package has an upper shoulder that projects into the package, the lid being provided with springs made of shape memory alloy on its lower face and being inserted, in a curved or roll-bent state, into the package, the springs taking support, in the expanded state, on a wall of the package.

DESCRIPTION OF THE DRAWINGS

The present invention will be understood more clearly from the following detailed description of several embodiments, given by way of non-restrictive examples and illustrated by the appended drawings, wherein.

MORE DETAILED DESCRIPTION

The invention is described here below with reference to a device for the hermetic closing of a metallic package such as a package enclosing electronic circuits, but it is clear that it is not limited to such an application, and that it can be implemented by the fast closing, which may be airtight closing or only liquid-proof closing, of different types of chambers which may or may not be metallic.

Figure 1:
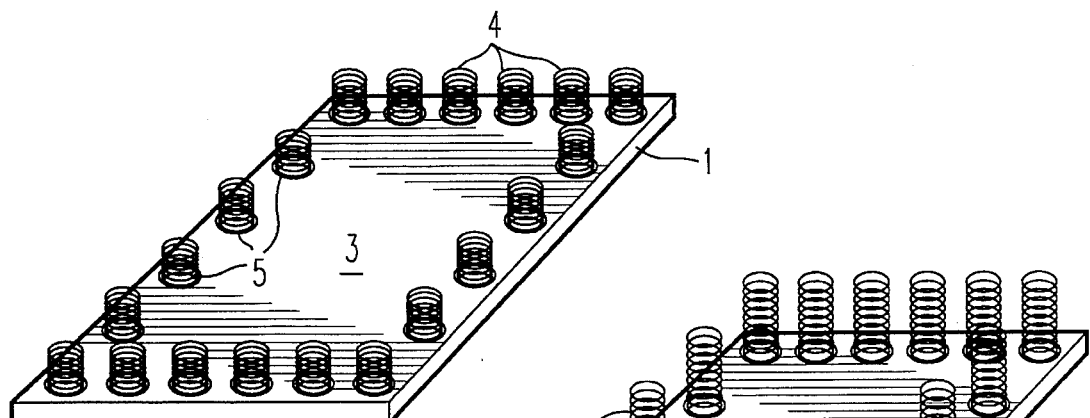
FIG. 1 shows a view in perspective of the lid of a first embodiment of a closing device according to the invention, this lid being provided with external springs made of shape memory alloy that are shown in the contracted state.
Figure 3:
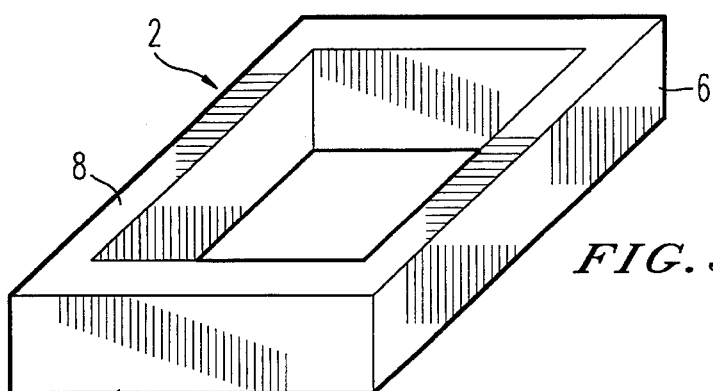
FIG. 3 shows a simplified view in perspective of the package to which the lid of FIG. 1 is applied.
Figure 4:
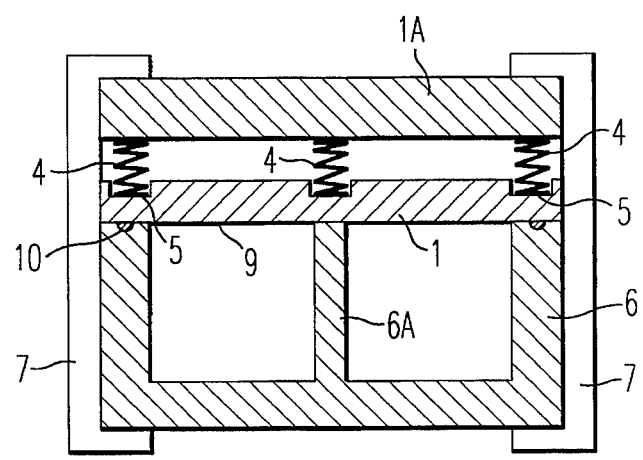
FIG. 4 shows a sectional view of the package of FIG. 3, hermetically closed by its lid.

FIG. 1 shows the lid 1 designed to carry out the airtight closing of a package 2 (which can be seen in FIGS. 3 and 4). The lid 1 is advantageously flexible and it has a thickness of about 0.5 mm. In the case of packages for microelectronic circuits, the package and the lid are made of the same material, for example Ti, Al or Cu.

The lid 2 herein is parallelepiped shaped, but it is clear that it may have any shape, provided that its upper face, to which the lid will be applied, is regular, i.e. provided that the lid can be easily adapted to this face (which is not necessarily plane).

The lid 1 is provided, throughout the rim of its outer face 3, with springs 4 made of SMA (shape memory alloy). These springs 4 are bonded, brazed or fixed by any appropriate means to the face 3 of the lid 1. The springs 4 are preferably evenly spaced out, their spacing then having a value, for example, of 2 mm to 10 mm if their external diameter is 1 mm to 5 mm. Advantageously, blind holes or recesses 5 are made in the face 3 at the locations of these springs in order to make it easier to position them. These blind holes have, for example, a circular section whose diameter is slightly greater than the external diameter of the springs, and are shallow (for example with a depth of 0.1 mm for a lid with a thickness of 0.5 mm), and they are of course placed so as to be in positions directly corresponding to the side walls 6 of the package 2.

Numerous studies have been carried out throughout the world on the making of shape memory alloys (see in particular "Shape Memory Alloys: Material In Action" and "General Discussion: The Use Of Shape Memory Actuators", Catholic University of Louvain).

The materials chiefly used are of the Ni Ti type or copper alloys of the Cu—Al—Ni or Cu—Al—Zn type, and the memory effect is based on a martensitic type reaction obtained by causing variation in the temperature of the alloy studied, this temperature variation being associated with a change in the shape of the alloy.

The range of temperatures varies from one type of alloy to another, and is between −100° C. and +200° C. approximately. Two types of memory effect must be noted: the one-way memory effect and the two-way memory effect. The two-way memory effect corresponds to the reversible change from a high-temperature shape or hot shape to a low-temperature shape or cold shape by a simple changing of temperature.

The making of springs, wires and plates out of shape memory alloys has many applications in all fields ranging from dental surgery to the automobile sector not to mention the field of domestic appliances (the potential applications identified have been listed together in the article by Mr. Van Humbeek, "From a Seed to a Need: the Growth of Shape Memory Applications in Europe").

A number of studies, especially in Japan and the United States, have been devoted to the use of shape memory alloys for the making of interconnections of electronic chips (Raychem Corporation: "Shape Memory Effect Alloys as an Interconnection Technology for IC Packages and PC Boards") or PGA (Pin Grid Array-Japanese) type packages of electronic components.

In the present case, when the SMA springs 4 are taken to a temperature lower than their transitional temperature (they are placed in a refrigerated place), they contract (FIG. 1). This enables the lid 1 to be inserted freely between the package 2 and a rigid facing plate 1A that is fixedly joined to the package 2 by means of brackets 7 gripping the package 2. Advantageously, the transmission temperature of the SMA elements constituting the springs 4 is chosen to be lower than the ambient temperature (or to the lowest temperature of operation or use of the components of the package 2).

Figure 2:
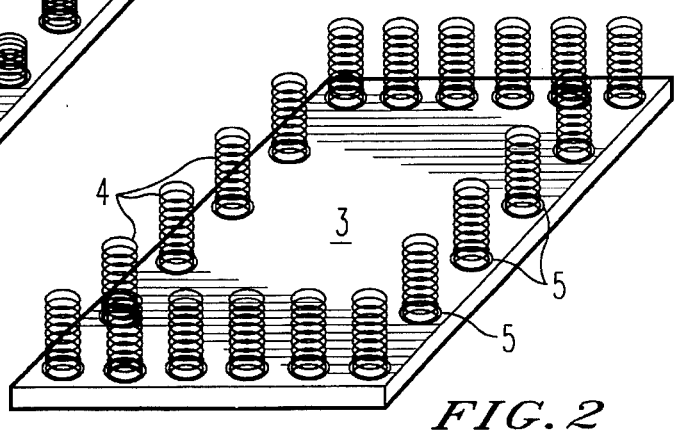
FIG. 2 shows a view in perspective of the lid of FIG. 1, its springs being in the expanded state.

When the temperature of the springs 4 is raised, these springs tend to recover their initial expanded form (as shown in FIG. 2) after having crossed said transition temperature, the lid 1 being placed, as indicated in FIG. 4, between the facing plate 1A and the package 2, the springs being directed towards this facing plate. These springs create a substantially uniform pressure on the lid 1, applying it hermetically against the upper face of the package 2. Naturally, to ensure a high degree of airtightness, the upper face 8 of the package 2 and the lower face 9 (which is contacted with face 3) must be even and not rough, and the springs 4 should remain close enough to each other. To improve airtightness, a seal is advantageously positioned between the faces 8 and 9: for example, as shown in FIG. 4, an O-ring seal 10 is positioned in a groove formed in the face 8.

Figure 5:
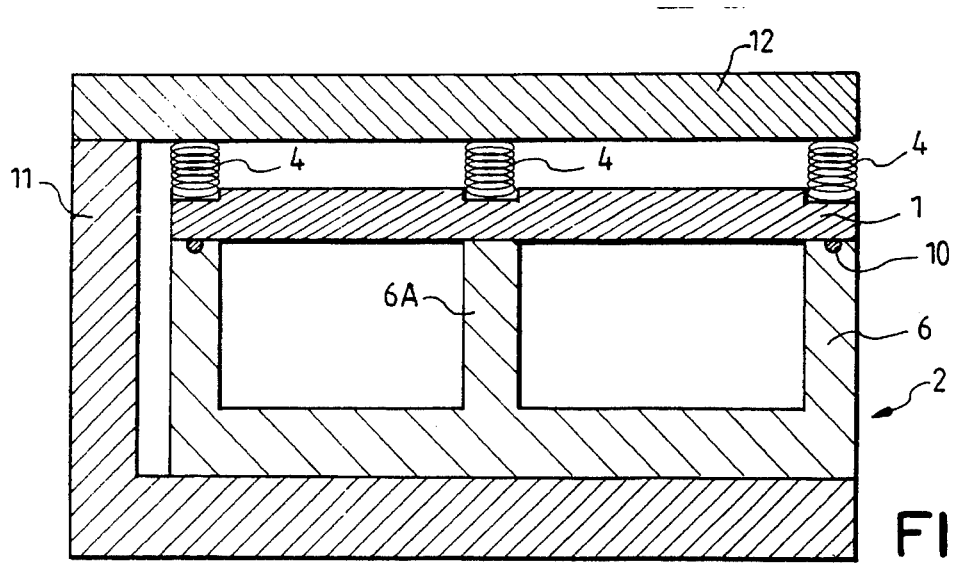
FIG. 5 shows a sectional view of an alternative embodiment of a closing device according to the invention.

FIG. 5 shows a variant of the embodiment of FIGS. 1 to 4. The same elements are given the same reference numbers. In this variant, a facing plate 11 with a U-shaped section surrounds the pack 2 and its lid 1. The distance between the lid 1 and the upper arm 12 of the facing plate 11 is smaller than the length of the springs 4 when they are relaxed (taken to ambient temperature) but slightly greater than the length of these same springs when they are compressed (cooled to a temperature below their critical temperature). Thus, at ambient temperature, the springs 4 apply the lid 1 hermetically to the package 2 in resting on the arm 12. In this embodiment, as in that of FIGS. 1 to 4, if there is an internal partition (6A), it is possible to provide for additional blind holes in the upper face of the lid 1, in positions directly corresponding to this partition to fix other SMA springs 4 therein in order to obtain good electrical contact between the lid 1 and this partition 6A. However if, as is generally the case, there is no need to provide airtightness between the two compartments of the package 2 demarcated by the partition wall 6A, the blind holes relating this partition wall may be spaced out at a greater pitch than the other blind holes (relating to the walls 6).

Figure 6:
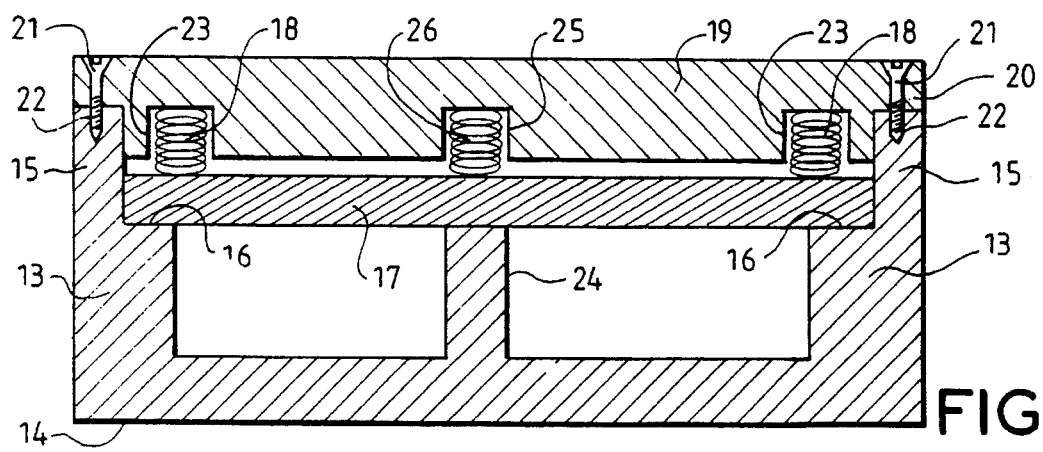
FIG. 6 shows a sectional view of another embodiment of a closing device according to the invention, with fast fixing of the lid by screws.

FIG. 6 shows an embodiment of an autonomous assembly of a package, lid and facing plate according to the invention.

In this assembly, the lateral walls 13 of the package 14 have an extension 15 that is slightly less thick than the walls 13. The external faces of the extension 15 are coplanar with the external faces of the walls 13, which means that a shoulder 16 is thus obtained on the upper face of the walls 13. On this shoulder 16, there is placed the flexible lid 17 which is held laterally by this extension 15.

Airtight sealing of the package 14 by the lid 17 is obtained by means of a facing lid 19 to which springs 18 are fixed. The lower face of the facing lid 19 has a contour with the same shape and dimensions as the aperture of the extension 15 so that it fits tightly into this aperture. On its upper periphery, the facing lid 19 has a shoulder 20 that rests on the upper face of the extension 15. The height of the extension 15 is somewhat equal to the sum of the thicknesses of the lid 17 and of the springs 18 (similar to the springs 4) in the compressed state. The rigid facing lid 19 is fixed by a fast fixing device to the extension 15. In the embodiment shown in the drawing, this fast fixing device is constituted for example by four screws 21 which fit into holes made, for example, in the corners of the shoulder 20 of the facing lid 19 (which is then assumed to have a substantially rectangular shape like the package 14) and is screwed into threaded holes 22 made in the corresponding corners, locally thickened if necessary, of the extension 15.

The screws 21 carry out secure fixing of the facing lid 19 to the package 14 (for example, there are only four screws to be screwed in while the number of springs 18 is substantially greater, there being several tens of these screws).

Blind holes 23, that are advantageously evenly spaced out, are made throughout the rim of the lower face of the facing lid 19 close to its periphery. The springs 18 are fixed into these blind holes. If, as shown in FIG. 6, the package has an internal partition wall 24, blind holes 25 may be made in the lower face of the facing plate 19, in positions directly corresponding to this partition wall 24. In these blind holes 25, there are fixed SMA springs 26 similar to the springs 18. However if, as is generally the case, there is no need to ensure imperviousness between the two compartments of the package 14 separated by the partition wall 24, but only very good electrical contact between the lid 17 and the partition wall 24 (which is necessary in microwave applications especially), the blind holes 25 can be spaced out at a greater pitch than the blind holes 23.

Figure 7:
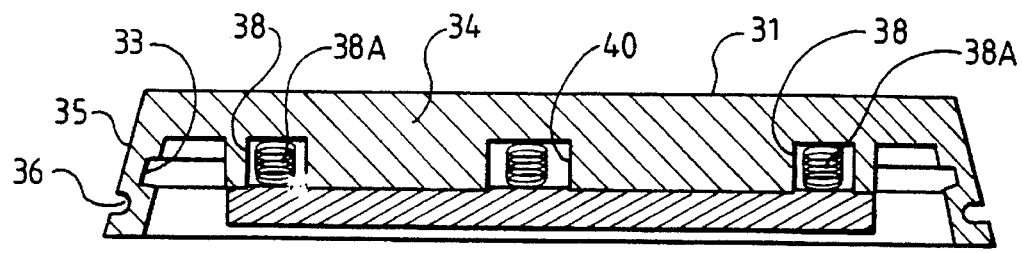
FIGS. 7 to 9 show sectional views, respectively of the lid, the package and the assembled unit for another embodiment of the closing device according to the invention, with the fastening of the lid by tongue-and-groove assembly and heat-shrinking gripping ring.
Figure 8:
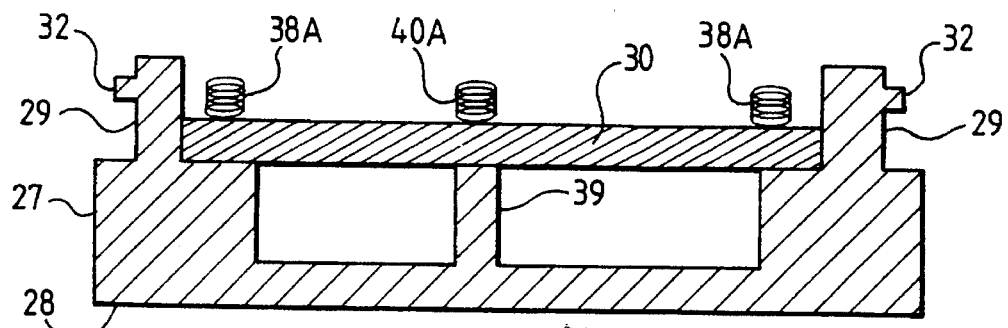
Figure 9:
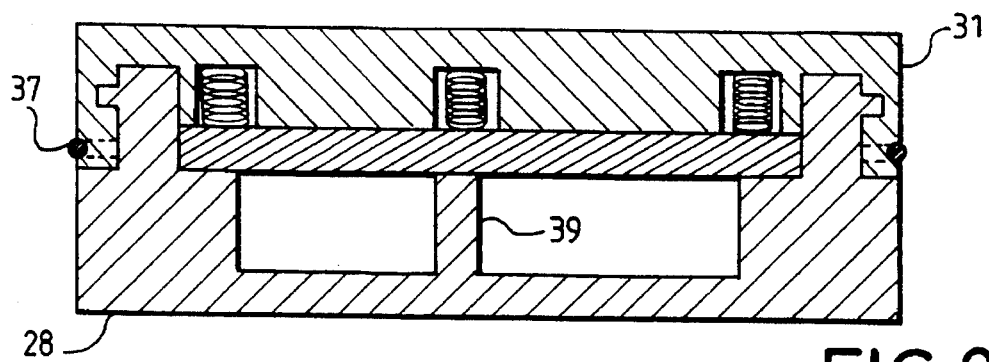

In the embodiment of FIGS. 7 to 9, the lateral sides 27 of the package 28 end in an extension 29 that is thinner than these sides. This extension 29 is recessed with respect to the internal faces of the lateral sides 27, thus forming a shoulder ensuring lateral positioning of the lid 30 on the upper face of the lateral sides 27. The extension 29 is also recessed with respect to the external faces of the lateral sides 27 so that the facing lid 31 does not go beyond its outer faces. Furthermore, a rib or tongue 32 is formed on the external face of the extension 29, this rib or tongue working together with a corresponding groove made 33 in the facing lid 31 in order to hold this facing lid 31 more efficiently on the package 28. Of course, the groove may be made in the extension 29 and the tongue in the facing lid 31.

The facing lid 31 has a body 34 in the form of a plate whose shape and dimensions are the same as those of the surface demarcated internally by the extension 29, so that it can be inserted tightly into this extension. The body 34 is extended on its upper periphery by a skirt 35 that is at least slightly flexible. Before assembly (FIG. 7), the skirt 35 occupies a position that diverges slightly with respect to the perpendicular to the plate 34 in order to enable the positioning of the facing lid 31 on the extension 29. On the periphery of its outer face, close to its edge, the skirt 35 has a groove 36 in which a SMA ring 37 is positioned during the placing of the facing lid 31. This ring 37 is made in such a way that it contracts when it is taken to a temperature greater than the critical temperature of the SMA that constitutes it. This critical temperature is chosen to be slightly lower than the ambient temperature. The dimensions of the ring 37 are such that in the "cold" (expanded) state it can easily be introduced into the groove 36 (the skirt 35 being folded back towards the extension 29 if necessary) and such that, in the "hot" (contracted) state, it penetrates to the bottom of the groove 36 and applies the skirt 35 forcefully to the outer face of the extension 29, and especially the tongue 32 into the groove 33. This ensures that the facing lid 31 is well fixed to the package 28. Naturally, other types of assembly of the facing lid with the package are possible (for example there could be a dovetailed assembly).

As in the exemplary embodiment of FIG. 6, the lower face of the facing lid 31 has, along the periphery of its body 34, blind holes 38 that are advantageously circular-sectioned with a diameter slightly greater than the external diameter of the SMA springs 39A which are fixed thereto by any appropriate means, for example by bonding. The depth of the blind holes 38 is slightly greater than the length of the springs in the "cold" state. The blind holes 38, which are made close to the periphery of the body 34, substantially so as to be in positions directly corresponding to the walls 27, are preferably equidistant and their spacing is, for example, about 39A for springs having an external diameter of about 1 to 5 mm. Naturally, the thickness of the body 34 of facing lid 31 is greater than the length of the springs 39A in the "cold" state. If, as is shown in the drawing, the package 38 has an internal partition wall 39 whose upper face is coplanar with the upper face of the wall 27, it is possible to improve the electrical contact between the lid 30 and this internal partition wall 39 by making blind holes 40 in the lower face of the body 34 in positions directly corresponding to this inner partition wall, SMA springs 40A, similar to the springs 38A, being fixed into these blind holes 40. As a variant, these springs 38A may be fixed to the upper face of the lid 30. These blind holes 40 do not need to be as close to each other as the blind holes 38 if, as is generally the case, there is no need to ensure airtightness between the two compartments of the package 28 demarcated by this internal partition wall.

Of course, the shrinking ring 37 can fulfil its function appropriately only if the partition 27 has a smooth contour. Should the package be substantially parallelepiped-shaped, the corners of the partition 27 should be rounded and the skirt 35 will evidently have the same rounded shape in the corresponding corners.

Figure 10:
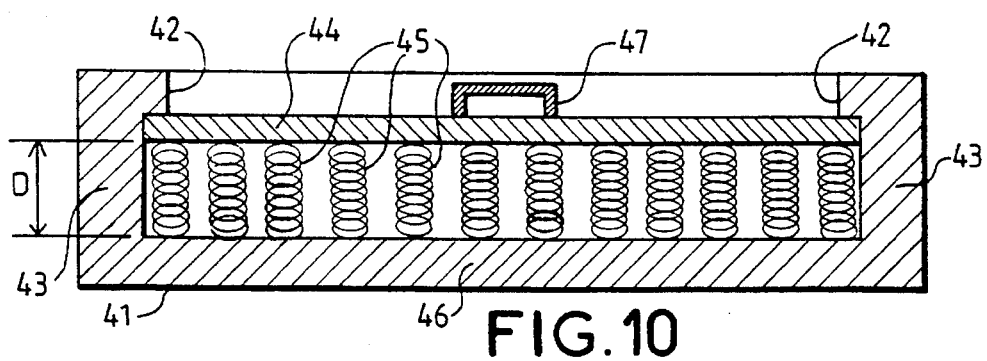
FIG. 10 shows a sectional view of another embodiment of the closing device according to the invention, with internal springs made of shape memory alloy.

FIG. 10 shows an embodiment of the closing device of the invention requiring_ neither a facing lid nor a bracket or U-shaped tool (as in the case of FIGS. 4 and 5), more especially suited to circular or substantially circular packages.

According to this embodiment, the package 41 has a short shoulder 42 in its upper part, perpendicular to its side walls 43 and pointed towards the exterior of the package. This package is closed by an SMA lid 44. The shape of the lid 44 is the same as that of the internal cross-section of the package 41, at least in its upper part, and the dimensions of the lid 44 are slightly smaller than the dimensions of said cross-section. The lid 44 is made so that, below the critical temperature of the material constituting it, it is domed, substantially in the shape of a spherical cap and so that above this critical temperature it is flat. When the lid is in the domed state, its rim has dimensions slightly smaller than those of the aperture demarcated by the shoulder 42.

Springs 45 made of SMA are fixed to the lower face of the lid 44. Below the critical temperature (the same as that of the material of the lid) of the material constituting these springs, the springs 45 are compressed, their length being then slightly smaller than the distance D between the bottom 46 of the package 41 and the lower face of the lid 44. Above this temperature, the springs 45 stretch and their length then, if their expansion is not hindered, is substantially greater than D.

The lid 44, provided with springs 45, is cooled to a temperature lower than its critical temperature. This makes it domed and enables it to be inserted into the aperture of the shoulder 42. So that it can be handled more easily, the lid 44 is provided with a handle 47 fixed approximately in the center of its upper face. When the lid 44 is inserted into the package 41, it is allowed to return to ambient temperature (or it is heated if necessary). As soon as the temperature of the SMA material of the lid and of its springs again goes above its critical temperature, the lid 44 straightens out and becomes planar, while the springs 45 expand and apply the lid 44 firmly against the shoulder 42. Of course, the number of springs 45 is sufficient to apply the lid 44 hermetically to the shoulder 42. To reinforce the airtightness, it is possible to make a peripheral groove inside the inner face of the shoulder 42 and house an O-ring seal (not shown) therein. If the package is deep, it is possible to make provision, along its lateral faces, for a wall parallel to the bottom of the package, on which the SMA springs take support.

Of course, for all the embodiments described here above, the package (hermetically sealed by its lid) can easily be opened by taking the package, or at least the parts made of SMA, to a temperature below the critical temperature of the SMA used.

Of course, if the package always has to be used at a low temperature (for example a temperature lower than 0° C.) or at least if the periods when it has to be used are periods when it is solely at low temperature, then the above-mentioned springs can be made in such a way that they are contracted above the critical temperature of the SMA material that constitutes them and are expanded below this temperature. Similarly, the ring 37 (FIG. 9) will then contract below its critical temperature and the lid 44 will be domed above its critical temperature and plane below this temperature.

What is claimed is:

1. A device for the airtight closing of fast open-and-shut packages; which comprises:
   a first lid fixed to an open face of a package, said package including an interior compartment;
   at least one shape memory alloy spring located outside said compartment and biasing the lid toward the compartment; and
   a facing lid fixedly connected to the package and facing the first lid wherein the springs are positioned between the first lid and the facing lid.

2. A device according to claim 1, wherein the facing lid is fixedly joined to the package by means of brackets.

3. A device according to claim 1, wherein the facing lid is U shaped and surrounds the package and the lid.

4. A device according to claim 1, wherein the facing lid is fixedly joined to the package by a fixing mechanism.

5. A device according to claim 4, wherein the fixing mechanism is screws.

6. A device according to claim 4, wherein the fixing mechanism comprises a groove and tongue arrangement.

7. A device according to claim 4, wherein the fixing mechanism comprise a ring made of a shape memory alloy forcing a flexible part of the facing plate against the package.

8. A device according to claim 1, wherein the facing lid has a blind hole within which the spring is positioned.

* * * * *